(12) United States Patent
Takase

(10) Patent No.: US 7,268,629 B2
(45) Date of Patent: Sep. 11, 2007

(54) SYSTEM AND METHOD FOR LOCK DETECTION OF A PHASE-LOCKED LOOP CIRCUIT

(75) Inventor: Satoru Takase, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 162 days.

(21) Appl. No.: 11/137,072

(22) Filed: May 25, 2005

(65) Prior Publication Data

US 2006/0267642 A1  Nov. 30, 2006

(51) Int. Cl.
*H03L 7/00* (2006.01)
(52) U.S. Cl. .................... 331/1 A; 331/16; 331/DIG. 2
(58) Field of Classification Search ................ 331/1 A, 331/16, DIG. 2
See application file for complete search history.

(56) References Cited

U.S. PATENT DOCUMENTS 6,714,083 B2    3/2004  Ishibashi
6,794,944 B2 *  9/2004  Hirai .......................... 331/1 A
7,116,145 B2 * 10/2006  Kim et al. ................... 327/156

* cited by examiner

*Primary Examiner*—Arnold Kinkead
(74) *Attorney, Agent, or Firm*—Sprinkle IP Law Group

(57) ABSTRACT

Systems and methods for detecting phase-locked loop circuit lock. In particular, a lock detector configured to detect PLL stability for a user-defined period of time prior to asserting a PLL-lock-detected output. Stability may be indicated by a counter inserted into a PLL circuit and arranged between a phase-frequency detector and a charge pump. Because the counter value is acted upon by the phase-frequency detector, PLL lock is indicated by counter value stability. The digital counter value may be provided to a digital charge pump and a lock detector simultaneously. The lock detector includes registers and difference detectors to determine when the difference between counter values is below a user-defined tolerance. The lock detector may include a variable timer to avoid false indications of lock which may occur when counter values are sampled with the same frequency as a fluctuation frequency of the counter value.

27 Claims, 4 Drawing Sheets

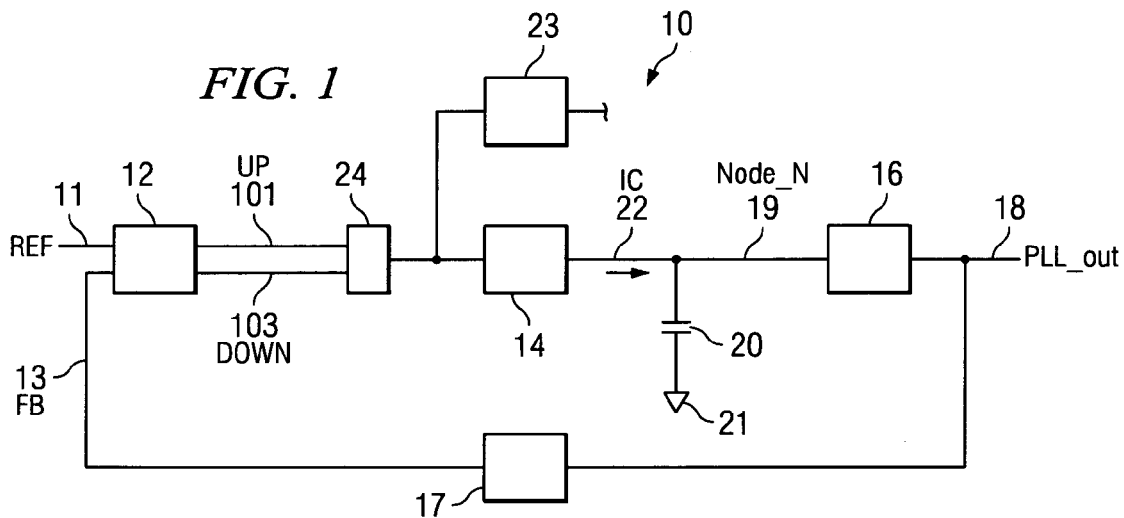
FIG. 1
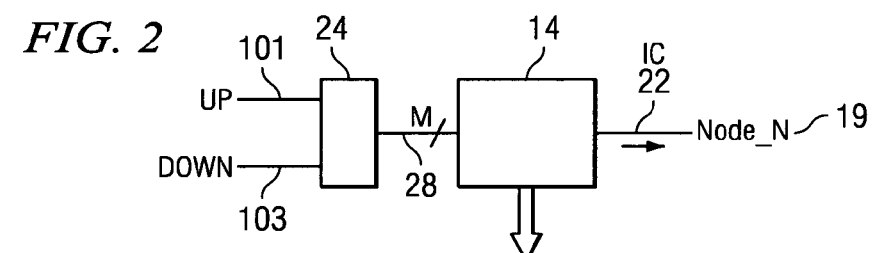
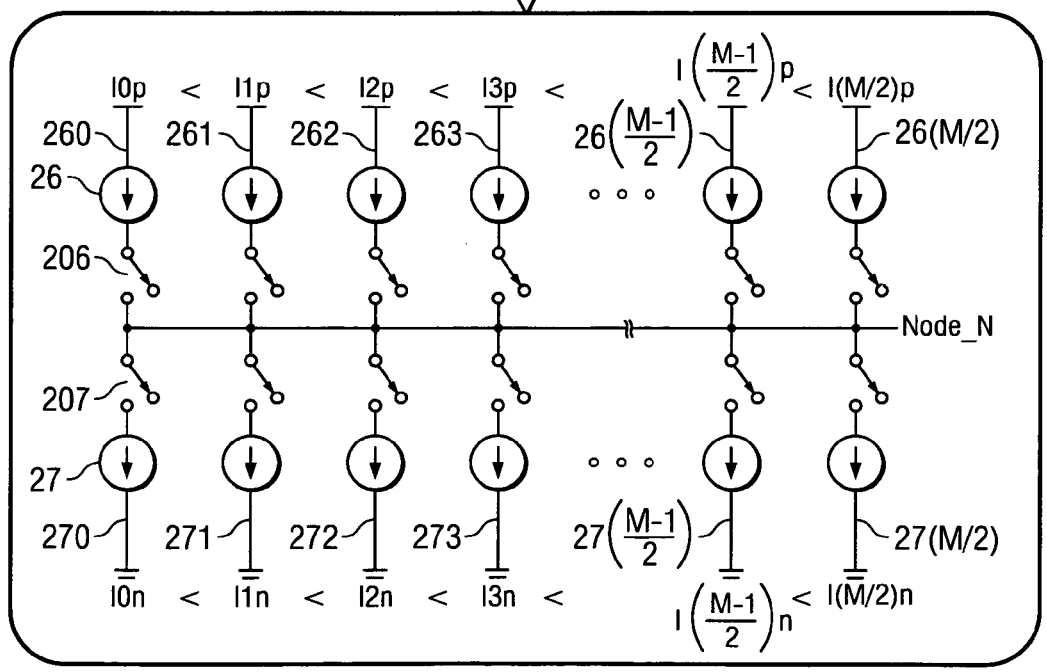
FIG. 2

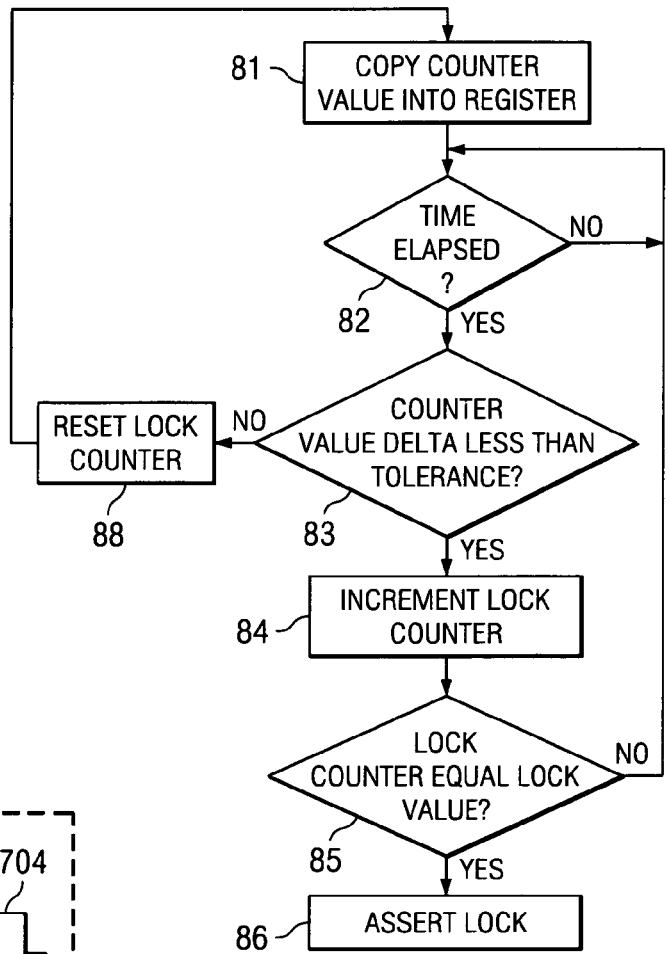
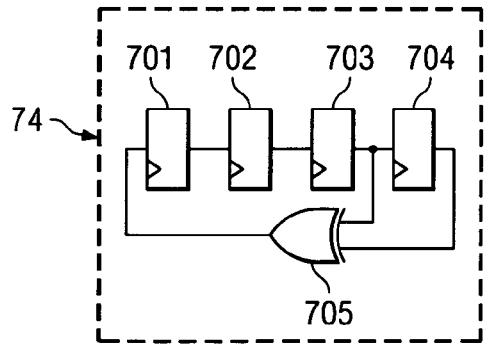
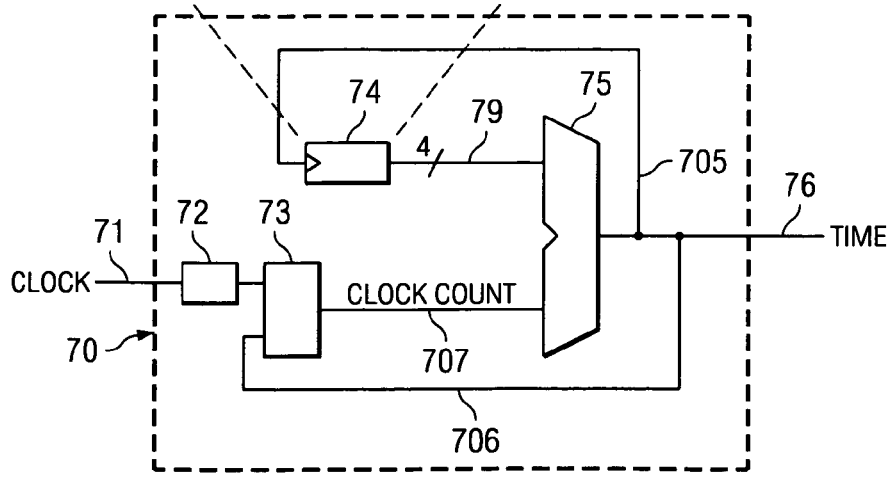

SYSTEM AND METHOD FOR LOCK DETECTION OF A PHASE-LOCKED LOOP CIRCUIT

TECHNICAL FIELD OF THE INVENTION

The present invention relates to a phase-locked loop circuit, and more particularly, to detecting lock of a PLL circuit.

BACKGROUND OF THE INVENTION

Phase-locked loops are widely used for various applications such as in digital electronics, signal telemetry, and communications applications. A typical PLL may include a phase-frequency detector, a charge pump, and a voltage-controlled oscillator.

Phase-locked loop integrated circuits receive an input frequency signal and produce an oscillator frequency output signal. The frequency of the oscillator output signal may be a multiple of the frequency of the input signal. The PLL is said to be locked when the PLL produces an oscillator output signal which has a frequency which is a multiple of the input frequency signal within some tolerance. It is noted that a multiple of one is possible. Some applications using PLL circuits may use information regarding PLL lock. Useful information may include whether the PLL circuit is locked and when the lock is achieved.

There are devices and methods for determining PLL lock within the prior art. However, some such devices and methods may at times incorrectly indicate that a PLL has achieved lock. Accordingly, it is desirable to configure PLL circuits such that PLL lock may be determined more reliably. In addition, such prior art locking devices and methods may require complicated circuitry to enable, and these complicated circuits may have large footprints. It is desirable to reduce the footprint of the PLL and its related circuitry. This is particularly true when considering PLL circuits manufactured using CMOS technologies. Thus, it is desirable to determine PLL lock using relatively simple circuitry which may have a reduced footprint size.

SUMMARY OF THE INVENTION

Systems and methods for improved phase-locked loop lock detection are disclosed. In particular, inserting a digital counter into a PLL circuit and providing the counter's value to a lock-detecting circuit configured to evaluate the counter value stability.

The described systems and methods reduce the occurrence of erroneous indications of PLL lock. A counter may preferably be inserted between a phase-frequency detector and a charge pump of a PLL circuit. In this configuration, a substantially constant counter value indicates PLL lock because the counter value is acted upon by the phase-frequency detector. The digital counter value may be provided to a PLL digital charge pump and to the lock detecting circuit simultaneously. A lock-detecting circuit detects the stability of the counter value for a user-defined period of time prior to asserting a PLL-lock-detected output. The lock detector includes registers and difference detectors to determine when the difference between counter values is below a user-defined tolerance. The lock detector may include a variable timer to avoid false indications of PLL lock which may occur when counter values are sampled with the same frequency as a fluctuation frequency of the counter value.

In one embodiment, a lock-detecting phase-locked loop circuit includes a phase frequency detector (PFD), a first counter, a charge pump, and a lock detector. The lock detector evaluates the stability of the counter value over time. The lock detector increments a second-counter value when sampled counter values are substantially matching. An output signal indicating PLL lock is asserted by the lock detector when the second-counter value exceeds a user-defined value. The embodiment may also include a timer having a pseudo-random sampling interval for acquiring counter values. Such a variable timer may include a linear feedback shift register.

In one embodiment, a device according to the invention detects a substantially stable digital signal. Such a device may be termed a lock detector. Such a lock detector may include a digital signal input port, a first register to buffer the digital signal, a first difference detector to compare a first input buffered in the first register with a second input from the input port, a second difference detector to compare the output of the first difference detector with a tolerance, a counter which increments if the tolerance is greater than the output of the first difference detector, and an output port which provides an asserted signal when the counter value reaches a pre-determined value. If the tolerance is less than the output of the first difference detector, the counter value may reset. The tolerance value and/or the pre-determined value may be held in additional register(s) and such values may be user-configurable. The lock detector may also include a variable timer.

In another embodiment, the invention includes a method for lock detection in a phase-locked loop circuit. The method includes comparing a PLL reference signal with a PLL feedback signal at various times to obtain values, and comparing the values with one another to obtain differences. The method further includes determining whether the differences are within a tolerance and incrementing a counter value if so. The method may include resetting the counter value when the differences are not within the tolerance. The method also includes asserting a counter output signal when the counter value achieves a pre-determined value, where the asserted counter output indicates PLL lock.

Thus, among other embodiments, improved PLL circuits including lock detection, improved methods of detecting PLL lock, and lock detectors where lock may be characterized by a substantially stable digital signal are provided.

A technical advantage of the invention is the ability to detect PLL lock by observation of a substantially stable digital signal. In particular, a counter is incorporated into a PLL circuit such that the counter receives input from a phase-frequency detector which compares a PLL input signal to a PLL feedback signal and provides output indicating the difference between the signals. Therefore, when a counter receiving input from a phase-frequency detector is observed to have a substantially stable value, the PLL is identified as locked.

Another advantage presented by this invention is the reduction in the number of erroneous indications of PLL lock. Observing stable counter values for a user-defined period of time may reduce such erroneous indications.

Similarly, false lock indications can be avoided by using a variable timer to obtain counter values for comparison. Sampling with a pseudo-random frequency may prevent sampling with a frequency that corresponds with a periodic PHASE-LOCKED LOOP feedback system frequency.

Yet another advantage presented by this invention is the reduction in footprint as compared to other phase-locked loop lock devices. Footprint reduction may be of particular importance for phase-locked loop circuits manufactured using CMOS technologies.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

FIG. 1 is a block diagram of a phase-locked loop circuit having a lock detector and configured according to the invention.

FIG. 2 is a block diagram of a digital charge pump, such as charge pump 14 shown in phase-locked loop 10 of FIG. 1.

FIG. 7 is one embodiment of a variable timer according to the invention.

FIG. 8 is a flow chart describing the operation of a phase-locked loop circuit having a lock detector according to the invention.

DETAILED DESCRIPTION

Figure 3:
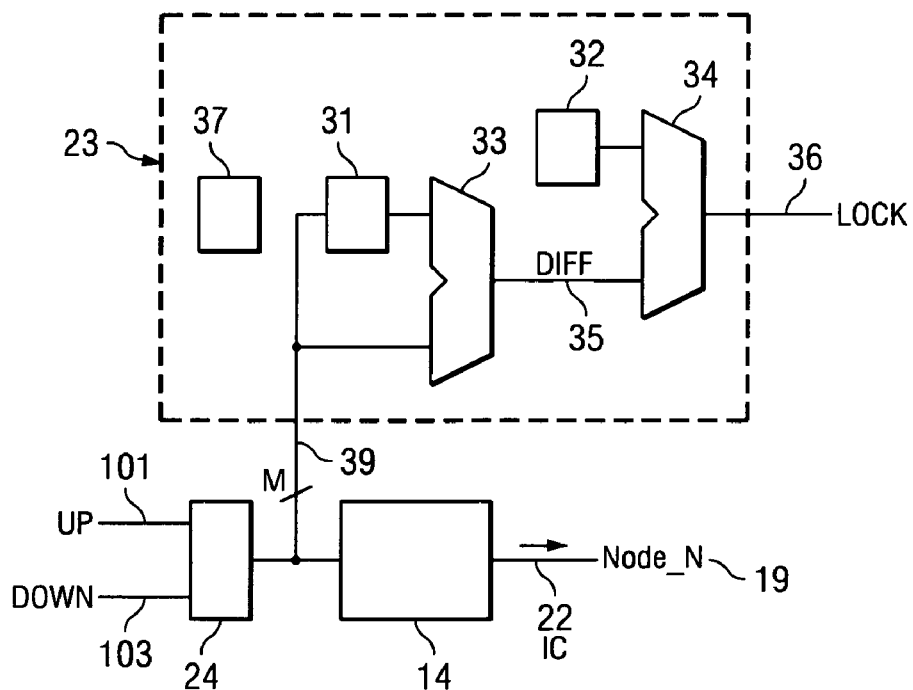
FIG. 3 is one embodiment of a lock detector according to the invention.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

FIG. 1 is a block diagram of one embodiment of a phase-locked loop electrical circuit having a lock detector.

Phase-locked loop circuit 10, as shown in FIG. 1, includes phase-frequency detector 12, charge pump 14, and voltage-controlled oscillator 16. Counter 24 and lock detector 23 are arranged and electrically coupled between phase-frequency detector 12 and charge pump 14, where charge pump 14 and lock detector 23 each receive input from counter 24. Node_N 19 electrically couples the output of charge pump 14 with the input to voltage-controlled oscillator 16. Arranged and electrically coupled between Node_N 19 and ground 21 is capacitor 20. Voltage-controlled oscillator 16 provides output signal PLL_out 18, which is routed through divider 17 to become feedback signal FB 13.

Phase-frequency detector 12 compares phase and frequency of input reference signal REF 11 with phase and frequency of feedback signal FB 13. Phase-frequency detector 12 generates difference signals from the comparison of input reference signal REF 11 and feedback signal FB 13. Phase-frequency detector 12 generates positive difference signal UP 101 and negative difference signal DOWN 103. UP signal 101 and DOWN signal 103 are provided to counter 24. Counter 24 holds a value which changes according to UP signal 101 and/or DOWN signal 103. For example, the value held by counter 24 may increment each time a pulse is received as input from UP signal 101 and decrement each time a pulse is received as input from DOWN signal 103. Counter 24 provides this counter value as input to charge pump 14. In turn, charge pump 14 generates current Ic 22, where Ic 22 is substantially proportional to the value held by counter 24.

Ic 22 is provided as an input signal to voltage-controlled oscillator 16. In turn, voltage-controlled oscillator 16 generates a periodic signal PLL_out 18. The periodic signal PLL_out 18 is provided as input to divider 17 and divider 17 in turn provides feedback signal FB 13 as input to phase-frequency detector 12. Differences between feedback signal FB 13 and reference signal REF 11 are detected by phase-frequency detector 12 and the counter value held in counter 24 changes according to differences between these signals. Thus, when the value held by counter 24 changes, current Ic 22 can change.

Therefore, output Ic 22 may be constant when the value held by counter 24 remains constant. The value held by counter 24 remains substantially constant when current sources UP 101 and DOWN 103 remain substantially constant, indicating phase-frequency detector 12 detects little or no difference between input signals REF 11 and FB 13. At phase-locked loop lock, signals REF 11 and FB 13 are substantially the same. Consequently, the value held by counter 24 remains substantially constant while phase-locked loop circuit 10 is locked.

Phase-locked loop circuit 10 is configured with lock detector 23 to determine if phase-locked loop circuit 10 is in a locked state. Lock detector 23 uses input from counter 24 to determine whether phase-locked loop circuit 10 is locked. In accordance with the invention, one embodiment of lock detector 23 is configured to determine whether counter value 24 remains substantially constant over a period of time. In another embodiment, counter values are sampled pseudo-randomly and are compared to determine whether the phase-locked loop is in a locked state (e.g., when the compared value is substantially constant, unchanged or changes within a defined amount FIG. 2 is a block diagram of one embodiment of a charge pump 14 for use in phase-locked loop circuit 10 of FIG. 1. Charge pump 14 can receive multiple lines of input from counter 24. In the configuration shown, charge pump 14 receives 'M' input lines from counter 24, where 'M' can be any number of bits, but 'M' is any even number in this example. Charge pump 14 may include a current source corresponding to and controlled by each input line.

FIG. 2 illustrates charge pump 14 including 'M' current sources. Half of the current sources are positive current sources and half are negative current sources. As shown, positive current sources include I0$p$ 260, I1$p$ 261, I2$p$ 262, I3$p$ 263, ..., I((M-1)/2)p 26((M-1)/2) and I(M/2)p 26(M/2) where I0$p$ 260 is less than I1$p$ 261, I1$p$ 261 is less than I2$p$ 262, etc. Also shown are negative current sources including I0$n$ 270, I1$n$ 271, I2$n$ 272, I3$n$ 273, ..., I((M-1)/2)n 27((M-1)/2) and I(M/2)n 27(M/2), where I0$n$ 270 has an absolute value which is less than the absolute value of I1$n$ 271, I1$n$ 271 has an absolute value which is less than the absolute value of I2$n$ 272, etc. Each current source can be electrically coupled to Node_N 22 by closing a switch. As an example, closing switch 206 will couple current source I0$p$ 260 to Node_N 22. As another example, closing switch 207 will couple current source I0$n$ 270 to Node_N 22.

As noted above, a value held by counter 24 can increment or decrement according to UP signal 101 and DOWN signal 103. This value is output from counter 24 to charge pump 14 via 'M' output lines 28, where each output line may control a specific current source. Positive current sources 26× and negative current sources 27× may compose current Ic 22. Therefore, current Ic 22 can increase or decrease according to UP signal 101 and DOWN signal 103. The value of counter 24, and thus the value of current Ic 22, may remain fixed when input to counter 24 (e.g., UP signal 101 and DOWN signal 103) remains substantially static.

FIG. 3 is one configuration of lock detector 23 as can be used in phase-locked loop circuit 10 in FIG. 1. Lock detector 23 may include register1 31, first difference detector 33, second difference detector 34, register2 32 and timer 37. Timer 37 is operable to provide a signal to initiate operation of, and is electrically coupled to, each of register1 31, first difference detector 33, second difference detector 34, and register2 32. In operation, lock detector 23 is electrically coupled to receive 'M' input lines 39, where 'M' can be any number of bits, but 'M' is any even number in this example. As shown, 'M' input lines 39 may be electrically coupled to each of register1 31 and first difference detector 33. Register1 31 also provides an input signal to first difference detector 33. Thus, first difference detector 33 is coupled to receive input from register1 31 and from input lines 39, where input lines 39 transmit the value of counter 24. Therefore, first difference detector 33 is configured to evaluate a change in counter value over a time period. The time period may be determined by periodic timer 37.

In operation of lock detector 23, upon expiration of a time period indicated by timer 37, a buffered counter value is compared to a current counter value. In operation, a first counter value is buffered into register1 31 at a first time. A period of time determined by timer 37 separates a first time from a second time. At a second time, a second counter value is buffered into register1 31, and the contents buffered into register1 31 at the first time are presented to the difference detector 33. Therefore, at the second time, the first difference detector 33 compares the first counter value with the second counter value. In this way, the stability of the value held in counter 24 from the first time to the second time is evaluated. The output from difference detector 33 is DIFF 35. At the second time, DIFF 35 is the difference between the first and second counter values.

Second difference detector 34 compares DIFF 35 with a value held in register2 32. The value held within register2 32 may be a pre-determined maximum allowable difference between counter values at phase-locked loop lock. The output of second difference detector 34 is LOCK 36. In one embodiment, LOCK 36 is asserted when the value held in register2 32 is greater than DIFF 35. Therefore, the output signal LOCK 36 may be asserted when the difference between a first counter value and a second counter value is less than a tolerance value held in register2 32, where the tolerance value represents the maximum allowable difference between counter values for the phase-locked loop to be in a locked state.

Figure 4:
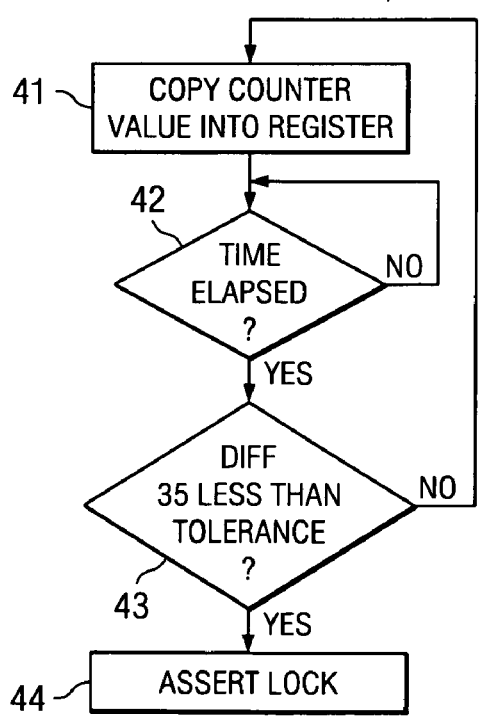
FIG. 4 is a flow chart describing the operation of a phase-locked loop circuit having a lock detector according to the invention.

FIG. 4 is a flow chart describing the operation of a phase-locked loop circuit having a lock detector such as lock detector 23 shown in FIG. 3. In step 41, a counter value is copied into a register, such as register1 31 as shown in FIG. 3. In step 42, a timer, such as timer 37, determines whether a sampling interval time period has elapsed. If the elapsed time period is less than the sampling interval, the flow chart remains at step 42 until the sampling interval time period has elapsed. When the sampling interval time period has elapsed, the flow chart continues to step 43.

In step 43, a difference detector determines the difference between a buffered value and a current value. For example, second difference detector 34 in FIG. 3 determines whether the output of first difference detector 33 comparing buffered and current values is less than a tolerance value held in register 32. If DIFF 35, the output of first difference detector 33, is greater than the tolerance value, the flow chart loops back up to step 41. At step 41, a new value is read into a register, such as register1 31, and the flow chart continues to step 42.

If in step 43 the difference DIFF 35 is determined to be less than the tolerance value by second difference detector 34 in FIG. 3, the output signal LOCK 36 is asserted by second difference detector 34 (e.g., as illustrated in FIG. 3). Therefore, the lock detector as shown in FIG. 3 asserts a lock-detected signal upon detection of two counter values that match within a tolerance value. Thus, step 44 represents indicating that a phase-locked loop locked condition has been determined. In step 44, an indication of phase-locked loop lock is provided.

Figure 5:
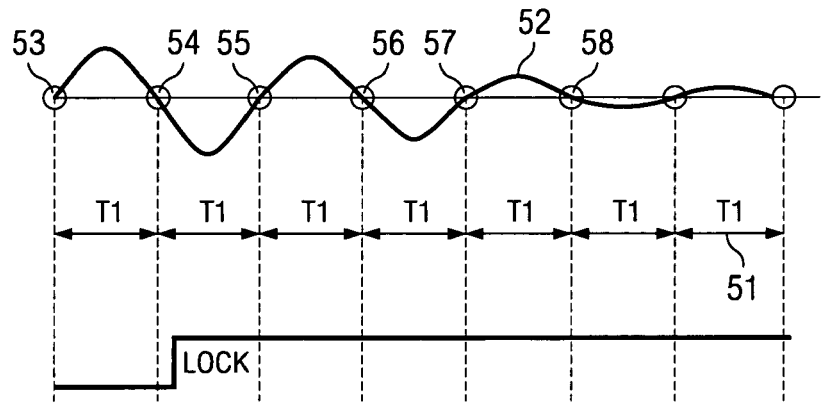
FIG. 5 is a graph illustrating one inherent limitation of lock detectors having a constant sampling frequency.

FIG. 5 is a graph illustrating a potential limitation of the above-described lock detector of FIG. 3 in which the lock detector may falsely indicate phase-locked loop lock. In particular, shown is at least one limitation of a lock detector using a timer with a constant period to determine sampling frequency. Shown in FIG. 5 is an oscillating signal 52 representing the counter value held in counter 24 and having a constant period t1 51.

For purposes of illustration, it is assumed that a phase-locked loop circuit is locked when the value of signal 52 is constant. To determine whether signal 52 is constant, the value of signal 52 is sampled periodically, and the values taken at each sample time are compared. In this example, the value of signal 52 is sampled at intervals of t1 51 and the value of signal 52 is initially sampled at time 53 and subsequently at times 54 through 58.

If the period for a periodic sampling interval is constant, it is possible to sample values that are in phase with the periodic signal. Therefore, a sampling frequency may be commensurate with the frequency of the sampled periodic signal. This can be problematic because the sampling may occur commensurate with periodic inflection points of the periodic signal. Therefore, the sampling may occur at or near that point in the periodic signal where the signal values transition from positive to negative, i.e., sampling may occur when the signal values are at or near zero, when assuming the value of signal 52 is zero at the horizontal axis.

For example, shown in FIG. 5 is a situation where values are sampled every time t1 51. The first sampling occurs at time 53, and the value of signal 52 is approximately zero at time 53. The next sampling occurs at time 54, and the value of signal 52 is once again approximately zero. In this manner, a false-positive phase-locked loop lock may be achieved. Despite numerous samples, taken for example at times 55, 56, 57, or 58, a false-positive phase-locked loop lock indication is obtained. False-positive phase-locked loop lock indications are possible given a periodic sampling interval if the sampling frequency matches the periodic signal and if the samples are taken when the periodic signal is at or near zero. False-positive phase-locked loop lock indications are also possible given a periodic sampling interval if the sampling frequency matches the periodic signal and if the sampled periodic signal has constant amplitude.

Figure 6:
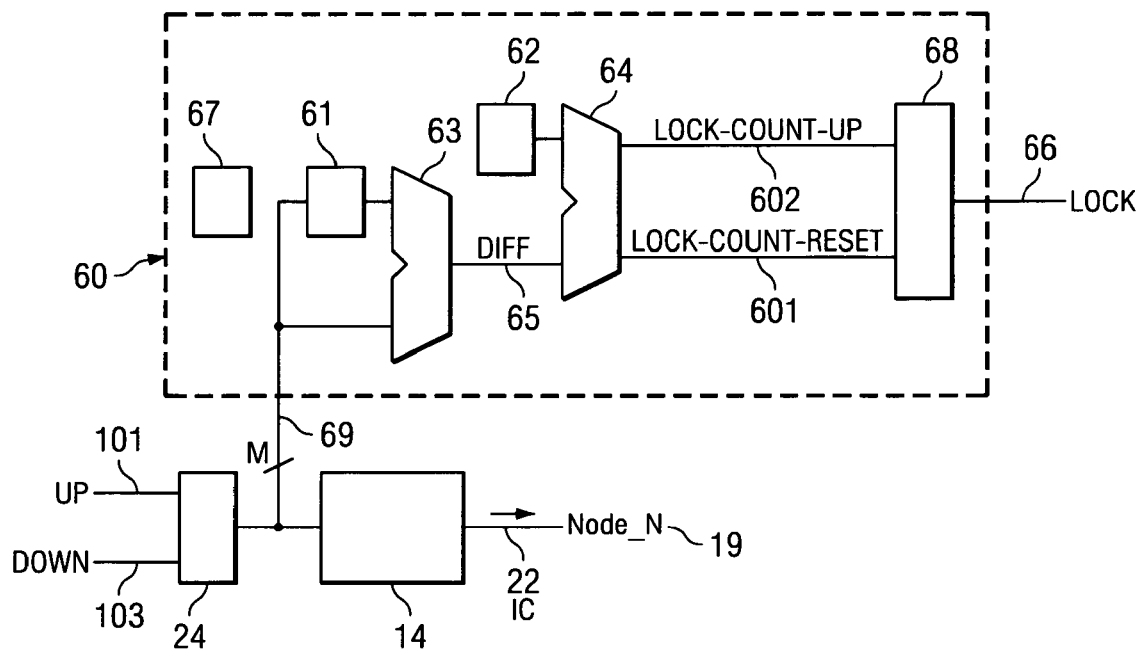
FIG. 6 is one embodiment of a lock detector according to the invention.

FIG. 6 is one embodiment of a lock detector according to the present invention that addresses this limitation. The improved lock detector 60 can be implemented in phase-locked loop circuits such as illustrated in FIG. 1. For example lock detector 60 can be implemented in phase-locked loop circuit 10 of FIG. 1 as lock detector 23.

Included in lock detector 60 may be register1 61, first difference detector 63, second difference detector 64, register2 62, timer 67, and lock counter 68. Timer 67 is adapted to provide a signal to initiate operation of, and is electrically coupled to, each of register1 61, first difference detector 63, second difference detector 64, register2 62 and lock counter 68. As described above in reference to FIG. 1, phase-frequency detector 12 generates positive difference signal UP 101 and negative difference signal DOWN 103. UP signal 101 and DOWN signal 103 are provided as input to counter 24. In operation, lock detector 60 receives 'M' input lines 69 from counter 24, where 'M' can be any number of bits, but 'M' is any even number in this example. These 'M' input lines transmit the value held in counter 24. The value held in counter 24 is incremented and decremented by the difference signals UP signal 101 and DOWN signal 103, respectively.

Counter 24 is electrically coupled to register1 61, to first difference detector 63, and to charge pump 14. The value held by counter 24 is transmitted by 'M' input lines 69 and may be simultaneously provided to register1 61, to first difference detector 63, and to charge pump 14. First difference detector 63 also receives input buffered by register1 61. Thus, first difference detector 63 is configured to evaluate counter value stability. Timer 67 determines the time period between compared counter values.

In operation of lock detector 60, upon expiration of a time period indicated by timer 67, a buffered counter value held in register1 61 is compared to a current counter value at difference detector 63. In operation, a first counter value is buffered into register1 61 at a first time. A period of time determined by a timer 67 separates a first time from a second time. At a second time, a second counter value is buffered into register1 61, and the contents buffered into register1 61 at the first time are electrically provided to the difference detector 63. Therefore, at the second time, the first difference detector 63 compares the first counter value with the second counter value. In this way, the stability of the value held in counter 24 from the first time to the second time is evaluated. The output signal from difference detector 63 is DIFF 65. At the second time, signal DIFF 65 is the difference between the first and second counter values from first difference detector 63.

Second difference detector 64 compares output signal DIFF 65 with the value held in register2 62. Register2 62 may hold a matching-tolerance value. The matching-tolerance value held in register2 62 may be pre-determined and/or user-configurable. When DIFF 65 is less than the matching-tolerance value, the values compared in first difference detector 63 are considered matching.

At the second time, the difference between the first counter value and the second counter value is compared with a tolerance value held in register2 62. Thus, at the second time the second difference detector 64 compares DIFF 65 with a matching tolerance value held in register2 62 to determine whether the first counter value substantially matches the second counter value.

The second difference detector 64 provides input to lock counter 68. Lock counter 68 has at least two input ports to receive signals LOCK-COUNT-UP input 602 and LOCK-COUNT-RESET input 601. When asserted, a LOCK-COUNT-UP input signal 602 will increment the value held in lock counter 68. However, when a LOCK-COUNT-RESET input signal 601 is asserted, the value held in lock counter 68 will reset. If the value held in register2 62 is less than DIFF 65, the LOCK-COUNT-RESET input 601 may be asserted and lock counter 68 may reset to zero. If the value held in register2 62 is greater than DIFF 65, the LOCK-COUNT-UP input 602 is asserted and the value held in lock counter 68 increments.

If the tolerance value in register 2 62 is greater than DIFF 65 at the second time, the first counter value substantially matches the second counter value, and LOCK-COUNT-UP 602 is asserted, thereby incrementing a value held by lock counter 68. When the value held in lock counter 68 reaches some pre-defined and/or user-configurable value, lock 66 is asserted.

A third counter value may be buffered into register1 61 from counter 24 at a third time. The period of time between the second time and the third time is determined by timer 67. At the third time, the counter value buffered into register1 61 at the second time is shifted to the difference detector 63. The third counter value is also presented to difference detector 63 at the third time. Thus, at the third time the second counter value is compared to the third counter value at difference detector 63.

Consequently, at the third time output DIFF 65 is the difference between the second counter value and the third counter value. DIFF 65 is presented to second difference detector 64 at the third time. At the third time, second difference detector 64 compares DIFF 65 with the value held in register2 62. Thus at the third time, the difference between the second counter value and the third counter value is compared with the matching tolerance value held in register2 62.

If the tolerance value in register 2 62 is greater than DIFF 65 at the third time, the second counter value substantially matches the third counter value. Therefore, LOCK-COUNT-UP 602 is asserted at the third time, and the value held by lock counter 68 increments at the third time. Thus, in this example, lock counter 68 holds the value of two at the third time. Assuming the pre-defined lock value is two, lock 66 is asserted at the third time.

Thus, FIG. 6 as described provides an improvement over the previously described lock detection because a user-determined number of within-tolerance counter values may be required to determine phase-locked loop lock. The number of within-tolerance counter values may be tallied at lock-counter 68. However, if a periodic timer is used to define the sampling interval, it may be possible that a false-positive lock signal be attained. Thus, a variable sampling interval is desirable. A variable timer 67 is therefore desirable. As noted, the time period between the first time and the second time and the time period between the second time and the third time are determined by a timer 67. When a variable timer is used as timer 67, the first time period does not necessarily match the second time period.

FIG. 7 is one embodiment of a variable timer 70 which may be utilized with embodiments of the present invention. The variable timer 70 can be implemented into phase-locked loop circuits such as illustrated in FIG. 6. For example variable timer 70 can be implemented into PLL 60 of FIG. 6 in place of timer 67.

Included in variable timer 70 may be divider 72, counter 73, difference detector 75, and linear feedback shift register 74. In operation, variable timer 70 receives electrical input from a clock signal 71. This clock signal may be electrically provided to divider 72. As shown in FIG. 7, a divided clock signal is provided as input to counter 73. Counter 73 counts the number of divided clock signals and electrically relays this number to an input of difference detector 75. Difference detector 75 also receives electrical input from linear feedback shift register 74.

In this example, linear feedback shift register 74 generates a pseudo-random 4-bit value 79, while it can have any number of bits. Linear feedback shift registers are known in the art. In the embodiment shown in FIG. 7, four registers 701, 702, 703, and 704 are included in linear feedback shift register (LFSR) 74. In operation, the registers of LFSR 74 shift their respective contents to an adjacent register when a clock input to the LFSR is activated. Thus, the register value in 701 is shifted to 702, the register value in 702 is shifted to 703, the register value in 703 is shifted to 704, and the register values in 704 and 703 are input to the LFSR feedback loop 705. LFSR feedback loop 705 includes an exclusive OR gate, and the values held in the third and fourth registers are provided as input to exclusive OR gate 705. The leftmost register 701 receives a new value from the output of the exclusive OR gate 705.

Difference detector 75 compares 4-bit value 79 from linear feedback shift register 74 with CLOCK COUNT 707 from counter 73. The pseudo-random value 79 is compared with a clock count value 707 representing a number of divided clock signals. When the number of divided clock signals as output by counter 73 exceeds the pseudo-random output of linear feedback shift register 74, the output signal TIME 76 is high.

TIME output signal 76 may be used as a pseudo-random clock signal for the lock-detector circuit 60 as shown in FIG. 6. Further, TIME output signal 76 may also be used to clock the LFSR 74. For example, TIME output signal 76 may be provided as a clock signal for register 701-704 in LFSR feedback loop 74 such that a new pseudo-random output is generated when TIME 76 output signal is asserted. Also, TIME 76 output signal maybe provided to counter reset loop 706 such that a new value 707 (i.e. zero), representing a number of divided clock signals, becomes available to difference detector 75. In this manner, variable timer 70 provides an output having a pseudo-random period.

FIG. 8 is a flow chart describing the operation of a phase-locked loop circuit having a lock detector according to the invention such as lock detector 60 shown in FIG. 6. FIG. 8 may also describe the operation of a phase-locked loop circuit having a variable timer such as shown in FIG. 7. In step 81, the value in counter 24 is copied into a register, such as register1 61 as shown in FIG. 6. In step 82, a counter, such as timer 37 or timer 67, determines whether a sampling interval time period has elapsed. If the amount of time is less than a sampling interval time period, the flow chart remains at step 82 until the sampling interval time period has elapsed. When the sampling interval time period has elapsed, the flow chart continues to step 83.

In step 83, a difference detector determines the difference between the buffered counter value and the current counter value. Thus the value held in register1 61 is compared with the value input from lines 69. The difference, or delta, between these counter values is output from difference detector 63 as DIFF signal 65. DIFF signal 65 is compared with a tolerance value held in second register 62. If the difference between counter values, represented by DIFF signal 65, is not less than the tolerance value held in second register 62 as determined by a difference detector 64 shown in FIG. 6, in step 88 the lock counter resets and the flow chart loops back up to step 81. If the difference between the counter values (i.e., DIFF signal 65) is less than the tolerance value in register 62, the flow chart continues to step 84.

In step 84, lock counter 68 is incremented. In step 85, a register determines if the value of lock counter 68 is sufficient. The value of lock counter 68 is considered sufficient to indicate phase-locked loop lock when a pre-determined user-definable lock value is reached. Reaching this user-definable value indicates phase-locked loop lock conditions have been observed long enough to assert an output signal indicating phase-locked loop lock, such as LOCK 66. If the value in lock counter 68 is not sufficient to indicate phase-locked loop lock, the flow chart loops back to step 82. If the value in lock counter 68 has reached the pre-defined lock value, the flow chart continues to step 86. In step 86, an output indicating phase-locked loop lock, such as LOCK 66, is asserted.

Figure 9:
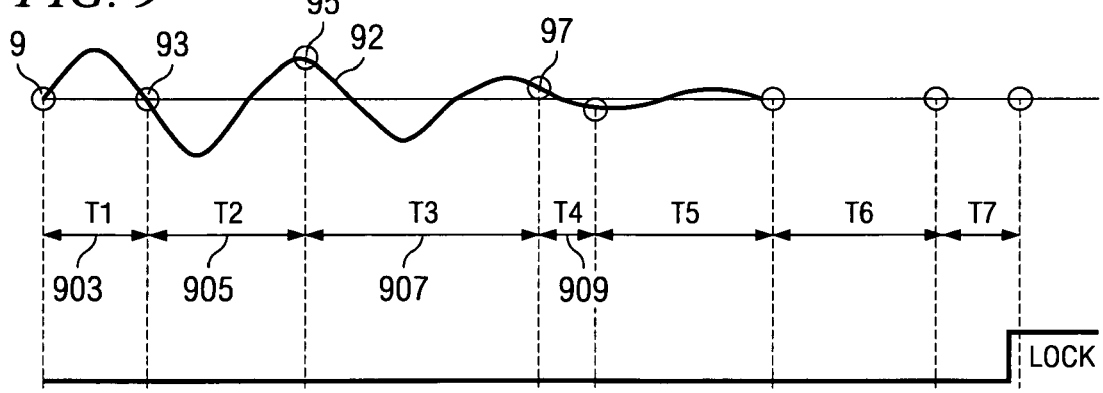
FIG. 9 is a graph illustrating improvements of a lock detector according to the invention.

FIG. 9 is a graph illustrating improvements of a lock detector using a pseudo-random timer according to the invention. FIG. 9 illustrates how this invention overcomes the problem of incorrectly indicating lock as described above in reference to FIG. 5.

Shown in FIG. 9 is an oscillating signal 92 having a constant period. Again for purposes of illustration, it is assumed that a phase-locked loop circuit is locked when the value of signal 92 is constant. To determine whether signal 92 is constant, the value of signal 92 is sampled, and the values taken at each sample time are compared. In this example, the value of signal 92 is initially sampled at time 91. Assuming the value of signal 92 is zero at the horizontal axis, the value of signal 92 at time 91 is zero. After time period t1 903, signal 92 is sampled at time 93. The value of signal 92 is again zero.

Thereafter, the value of signal 92 is sampled at irregular, pseudo-random intervals (e.g., $t_1 \ne t_2 \ne t_3 \ne t_4 \ne t_5 \ne t_6 \ne t_7 \ne t_8$). Therefore, although the value of signal 92 is zero at periodic intervals, these zero values are not necessarily sampled because the sampling is not occurring at a periodic interval. For example, after time period t2 905, signal 93 is sampled at time 93 and a non-zero result is obtained. Time period t2 905 is not equivalent to time period t1 903. In this way, false lock indication is avoided. For example, each time period t1 903, t2 905, t3 907, and t4 909 is unique.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A lock-detecting phase-locked loop circuit comprising:
    a phase frequency detector that receives a clock signal and a feedback signal, and provides an up signal and a down signal;
    a first counter that holds a first-counter value, wherein the first-counter value is incremented by the up signal and decremented by the down signal;
    a lock detector that:
        receives the first-counter value;
        compares a first-counter value sampled at a first time with a first-counter value sampled at a second time; and
        determines whether said sampled first-counter values are substantially matching.

2. The lock-detecting phase-locked loop circuit as recited in claim 1, further comprising a second counter, wherein the lock detector increments a second-counter value when sampled counter values are substantially matching.

3. The lock-detecting phase-locked loop circuit as recited in claim 2, further comprising an output port, wherein the output port provides an asserted signal when said second-counter value exceeds a user-defined value.

4. The lock-detecting phase-locked loop circuit as recited in claim 1, wherein the lock detector comprises:
    a first register configured to buffer a first-counter value sampled at a first time;
    a first difference detector configured to compare the buffered first-counter value with a first-counter value with a first-counter value sampled at a second time;
    a second difference detector configured to compare an output of the first difference detector with a pre-determined value; and
    a second counter configured to:
        increment a second-counter value when the output of the first difference detector is less than the pre-determined value, and
        assert an output when the second-counter value reaches the user-defined value.

5. The lock-detecting phase-locked loop circuit as recited in claim 4, wherein the lock detector further comprises a timer configured to initiate said sampling.

6. The lock-detecting phase-locked loop circuit as recited in claim 5, wherein the timer is further configured having a pseudo-random sampling interval.

7. The lock-detecting phase-locked loop circuit as recited in claim 6, wherein the timer comprises:
    a linear feedback shift register configured to provide a pseudo-random output;
    a divider configured to receive a clock signal as an input and to provide a divided clock signal as an output;
    a clock-counter configured to hold a value, wherein said clock-counter value is acted upon by the divider; and
    a third difference detector configured to:
        receive as a first input the pseudo-random output,
        receive as a second input the clock-counter value, and
        provide an asserted variable-timer output if the clock-counter value is greater than the pseudo-random output.

8. The lock-detecting phase-locked loop circuit as recited in claim 1, further comprising an output frequency greater than about 1 GHz.

9. A lock-detecting phase-locked loop circuit comprising:
    a first counter configured to:
        hold a counter value, and
        provide a digital counter value; and
    a lock detector operable to receive the digital counter value, the lock detector comprising:
        a first register configured to buffer the digital counter value;
        a first difference detector configured to compare the buffered digital counter value with a current digital counter value;
        a second difference detector configured to compare an output of the first difference detector with a pre-determined value; and
        a second counter configured to:
            increment a second-counter value when an output of the first difference detector is less than the pre-determined value, and
            assert an output signal when the second-counter value reaches a user-defined time period.

10. The lock-detecting phase-locked loop circuit as recited in claim 9, further comprising an output frequency greater than about 1 GHz.

11. The lock-detecting phase-locked loop circuit as recited in claim 10, wherein the lock detector further comprises:
    a linear feedback shift register configured to provide a pseudo-random output;
    a divider configured to receive a clock signal as an input and to provide a divided clock signal as a divider output;
    a clock-counter configured to:
        hold a clock-counter value,
        receive the divider output as an input, and
        increment the clock-counter value according to the divider output; and
    a third difference detector configured to:
        receive as a first input the pseudo-random output,
        receive as a second input the clock-counter value, and
        provide an asserted variable-timer output if the clock-counter value is greater than the pseudo-random output.

12. The lock-detecting phase-locked loop circuit as recited in claim 11, further comprising:
    a phase frequency detector, wherein the phase-frequency detector is configured to:
        increment the counter value with an UP output signal, and
        decrement the counter value with a DOWN output signal; and
    a charge pump, wherein the charge pump is configured to:
        receive the digital counter value as input, and
        provide to an input node of a voltage-controlled oscillator an output proportional to the counter value.

13. A lock detector for determining lock in a circuit comprising:
    a first difference detector configured to provide a first difference, wherein the first difference comprises a difference between a digital signal buffered in a first register at a first time and a digital signal provided to the first difference detector at a second time and the first difference is determined at the second time;

a second difference detector configured to receive the first difference;

a counter configured to increment a counter value if the first difference is within a tolerance; and an output port, wherein the output port provides an asserted signal if the counter value is not less than a pre-determined value.

14. The lock detector as recited in claim 13, further comprising a timer configured to determine a time period between the first time and the second time.

15. The lock detector as recited in claim 14, wherein the variable timer comprises:

a linear feedback shift register configured to provide a pseudo-random output;

a divider configured to receive a clock signal as an input and to provide a divided clock signal as a divider output;

a clock-counter configured to hold a value and to receive the divider output as an input, wherein said clock-counter is adapted to increment the value according to the divider output; and a third difference detector configured to:
receive as a first input the pseudo-random output,
receive as a second input the value held by the clock-counter, and
provide an asserted variable-timer output if the value held by the clock-counter is greater than the pseudo-random output.

16. The lock detector as recited in claim 15, wherein the variable timer further comprises:

a shift-register feedback loop configured to clock the linear feedback shift register with the asserted variable-timer output, wherein said clocking generates a new pseudo-random output, and a clock-counter feedback loop configured to reset the clock-counter with the asserted variable-timer output.

17. The lock detector as recited in claim 16, wherein the lock detector further comprises a second register configured to hold a pre-determined value, and wherein the second difference detector is further configured to receive the pre-determined value and to compare the first difference with the pre-determined value.

18. The lock detector as recited in claim 17, wherein the output provided by the second difference detector comprises a count-up signal, wherein the count-up signal is asserted when the first difference is less than the pre-determined value, and wherein the counter is further configured to increment the counter value when the count-up signal is asserted.

19. The lock detector as recited in claim 18, wherein the output provided by the second difference detector comprises a reset signal, wherein the reset signal is asserted when the first difference is more than the pre-determined value, and wherein the counter is further configured to reset the counter value when the reset signal is asserted.

20. The lock detector as recited in claim 18, wherein the lock detector is adapted to determine lock of a phase-locked loop circuit, and wherein the phase-locked loop circuit has an output frequency greater than about 1 GHz.

21. The method of lock detection for a phase-locked loop circuit (PLL), said
method comprising:
obtaining a first counter value at a first time;
obtaining a second counter value at a second time;
comparing the first counter value with the second counter value to obtain a first difference;
incrementing a lock-counter value if the first difference is within a tolerance;
and asserting a lock-counter output when the lock-counter value achieves a pre-determined value,
obtaining a third counter value at a third time;
comparing the second counter value with the third counter value to obtain a second difference;
incrementing the lock-counter value if the second difference is within the tolerance; and
resetting the lock-counter value if the second difference is not within the tolerance.

22. The method as recited in claim 21, further comprising resetting the lock-counter value if the first difference is not within the tolerance.

23. The method as recited in claim 22, wherein a first time interval separates said first time from said second time, wherein a second time interval separates said second time from said third time, and wherein said first time interval is not equivalent to said second time interval.

24. The method as recited in claim 23, further comprising generating values to define said first and second time intervals.

25. The method as recited in claim 24, wherein said comparing the first counter value with the second counter value to obtain a first difference comprises:

storing the first counter value into a first register at a first time; and comparing at a first difference detector the stored first counter value to the second counter value at a second time.

26. The method as recited in claim 25, wherein said comparing the second counter value with the third counter value to obtain the second difference comprises:

storing the second counter value into the first register at the second time; and comparing at a first difference detector the stored second counter value to the third counter value at a third time.

27. The method as recited in claim 26, further comprising configuring the phase-locked loop circuit with an output frequency greater than about 1 GHz.

* * * * *